United States Patent [19]

Gordon

[11] Patent Number: 4,468,074
[45] Date of Patent: Aug. 28, 1984

[54] SOLDERLESS CONNECTION TECHNIQUE AND APPARATUS

[75] Inventor: Herman B. Gordon, Tempe, Ariz.

[73] Assignee: Rogers Corporation, Rogers, Conn.

[21] Appl. No.: 34,001

[22] Filed: Apr. 30, 1979

Related U.S. Application Data

[63] Continuation-in-part of Ser. No. 907,958, May 22, 1978, abandoned.

[51] Int. Cl.³ .............................................. H01R 23/72
[52] U.S. Cl. .............................. 339/75 N; 335/17 CF
[58] Field of Search ........ 339/17 R, 17 CR, 176 MR, 339/176 MP, 175 M, 175 MP, DIG. 3, 174

[56] References Cited

U.S. PATENT DOCUMENTS

| | | | |
|---|---|---|---|
| 3,335,327 | 8/1967 | Damon et al. | 339/17 CR X |
| 3,701,964 | 10/1972 | Cronin | 339/94 M X |
| 3,825,878 | 7/1974 | Finger et al. | 339/176 MR X |
| 3,874,768 | 4/1975 | Cutchaw | 339/17 CR |
| 3,977,756 | 8/1976 | Rodondi | 339/17 F X |
| 3,988,648 | 10/1976 | Robinson | 339/17 CR X |
| 3,998,512 | 12/1976 | Anhalt et al. | 339/17 CR |
| 4,164,003 | 8/1979 | Cutchaw | 339/117 CF X |
| 4,166,665 | 9/1979 | Cutchaw | 339/117 CF X |

Primary Examiner—Eugene F. Desmond
Attorney, Agent, or Firm—Fishman & Dionne

[57] ABSTRACT

Contact portions of a first array of conductive elements are urged against mating contacts of a second array by a pressure applicator comprising a resilient open celled plastic material to establish and maintain an electrical connection therebetween.

4 Claims, 8 Drawing Figures

SOLDERLESS CONNECTION TECHNIQUE AND APPARATUS

CROSS-REFERENCE TO RELATED APPLICATIONS:

This application is a continuation-in-part of application Ser. No. 907,958 filed May 22, 1978, now abandoned.

BACKGROUND OF THE INVENTION

1. Field of the Invention

The present invention relates to methods of interconnecting electrical circuit elements. More specifically, the present invention relates to solderless connectors for establishing and maintaining electrical contact between circuit elements. Accordingly, the general objects of the present invention are to provide novel and improved methods and apparatus of such character.

2. Description of the Prior Art

The conventional method of interconnecting spacially displaced electrical or electronic circuit components consists of soldering terminals on the components to conductors which deliver current to or from the components. Thus, by way of example only, electronic circuit components are often interconnected by flexible circuits. A typical flexible circuit will comprise a sheet of plastic which functions as a supporting substrate for a multiplicity of conductors. Terminal portions of these conductors will be exposed to allow for establishment of permanent electrical contact, by soldering, between the conductors of the flexible circuit and contacts on another circuit, a connector or active or passive devices. Generally speaking, it has been required that the plastic used for the substrates of prior flexible circuits be capable of withstanding the relatively high temperatures to which the plastic would be exposed during soldering.

It has been found desirable, in some applications, to replace soldering as a technique for use in establishing connections to flexible and other circuits. In these applications the requisite electrical contact may be established by mechanically pressing the terminal portions of the circuit against terminal pads on the connector, device or another circuit. Such prior art pressure connections are customarily made with the aid of a solid resilient pressure applicator, such as a rubber member, which is placed in compression to bias at least one of the components to be electrically interconnected toward the other component to hold the terminal portions thereof in electrical contact.

While pressure connections of the type briefly described above facilitate circuit assembly and repair, and also allow for the use of low cost and low temperature plastics while eliminating the time consuming and thus costly step of soldering, the prior art pressure connectors have had a serious deficiency. U.S. Pat. No. 3,825,878 is believed to exemplify prior art pressure applicators for use in connecting a flexible circuit to a printed circuit board. The pressure applicators of U.S. Pat. No. 3,825,878 are disclosed as being formed of a solid silicone rubber which is highly resilient and which has substantial memory so that it returns to its original shape. When a solid rubber member is urged in one direction, that direction being defined as the Z coordinate of the rubber, the material compresses in the Z direction. However, as a result of compression in the Z direction, the solid rubber member deforms outwardly in directions defined by coordinates X and Y which are transverse to the Z coordinate. This transverse deformation may cause relative movement between the terminal portions of the circuits and may thus result in a failure to establish the desired electrical circuit. The problem of relative terminal movement resulting from transverse deformation of the resilient pressure applicator becomes particularly acute where, as is the typical situation, it is desired to establish electrical contact between a plurality of closely spaced terminals on a pair of circuit components such as, by way of example only, terminal portions of a first flexible circuit and those of either a second flexible circuit or a printed circuit on a rigid substrate.

SUMMARY OF THE INVENTION

The present invention overcomes the above briefly discussed and other deficiencies and disadvantages of the prior art by providing a solderless method of and apparatus for interconnecting various types of electrical circuit elements. Apparatus in accordance with the present invention comprises a pressure applicator characterized by use of a resilient member with minimal transverse deformation in response to the application of force in the direction of the contacts to be established. The resilient members of this invention are comprised of an open celled foam material having a compression set of less than 5% and preferably a compressive load deflection of about 25% with the application of 5 to 10 psi. Use of such an open celled resilient material in accordance with the present invention permits a plurality of closely spaced exposed electrical conductors on or extending from a pair of substrates to be aligned and thereafter reliably pressed together with the electrical connections established by alignment of the substrates being maintained as the requisite contact pressure is applied.

The present invention may be employed to interconnect flexible circuits, to connect flexible circuits to circuits on rigid substrates, to establish connections between the leads extending from an integrated circuit and a circuit pattern on a flexible or rigid circuit board and in other applications.

BRIEF DESCRIPTION OF THE DRAWING

The present invention may be better understood and its numerous objects and advantages will become apparent to those skilled in the art by reference to the accompanying drawing wherein like reference numerals refer to like elements in the several FIGURES and in which.

DESCRIPTION OF THE PREFERRED EMBODIMENTS

Figures 1, 2:
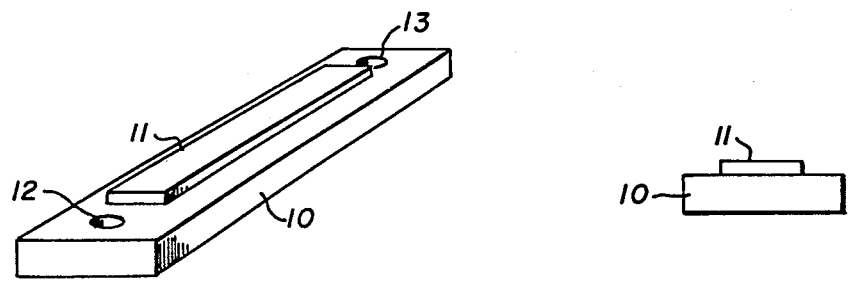
FIG. 1 is a perspective view of a pressure bar including a resilient cellular pressure applicator, the bar and applicator comprising part of a solderless connector in accordance with an embodiment of the present invention.
FIG. 2 is a side view of the apparatus of FIG. 1.

Referring jointly to FIGS. 1 and 2, a pressure bar 10 in accordance with a first embodiment of the present invention has a generally rectangular shape. A rectangular pad 11 of resilient cellular material, particularly an open celled material, is adhered to one surface of bar 10. Pressure bar 10 also includes through-holes 12 and 13 whereby, in the manner to be described below, force in a direction transverse to that surface of the bar to which the pad 11 is adhered may be applied. The nature of resilient cellular pressure applicator 11 is a particularly novel feature of the present invention and will be described in detail hereinafter.

Figure 3:
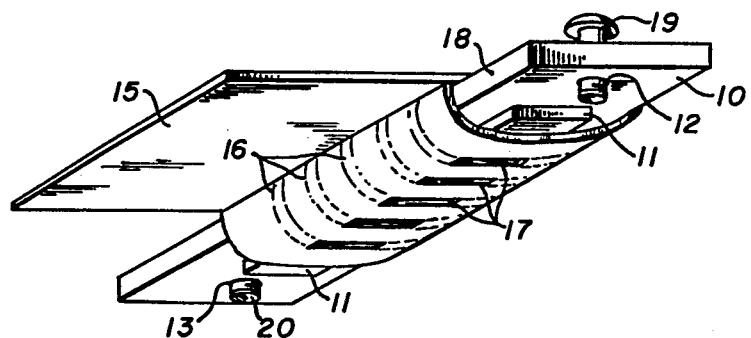
FIG. 3 is a perspective view of the apparatus of FIGS. 1 and 2 with a flexible circuit secured thereto.

Referring to FIG. 3, a flexible circuit 15 is shown secured, by means of an adhesive for example, to the portion of a solderless connector shown in FIGS. 1 and 2. Flexible circuit 15 includes a sheet of flexible plastic which functions as a supporting substrate for a plurality of electrical conductors 16. The flexible circuits which may be employed in accordance with the present invention may utilize, as the substrate material, polymeric materials such as polyester films. In a typical application, the conductors 16 are closely spaced and parallel and define the circuit pattern of flexible circuit 15. Also in the typical case, the conductors 16 will be covered by a coating of a suitable insulation material and this insulation material may be selectively removed by techniques such as chemical etching. Thus, the protective insulation will be removed in discrete regions 17, or along a lateral band, so as to expose the conductors 16 in a region or regions which are in alignment with the resilient pressure applicator pad 11. The exposed portions 17 of the circuit conductors 16 will, after removal of the protective coating of insulation therefrom, extend outwardly from the sub-assembly of FIG. 3 to define a plurality of spaced contact pads. It will be understood that the securing of flexible circuit 15 to pressure bar 10 may be accomplished by the use of a suitable adhesive and/or by mechanical engagement between the circuit and the bar. Thus, by way of example, the pressure bar 10 may include an elongated groove which receives the end of circuit 15. Screws 19 and 20 are inserted respectively in through-holes 12 and 13 of bar 10 to provide for attachment of the sub-combination of FIG. 3 to the circuit and connector portion depicted in FIG. 4.

Figure 4:
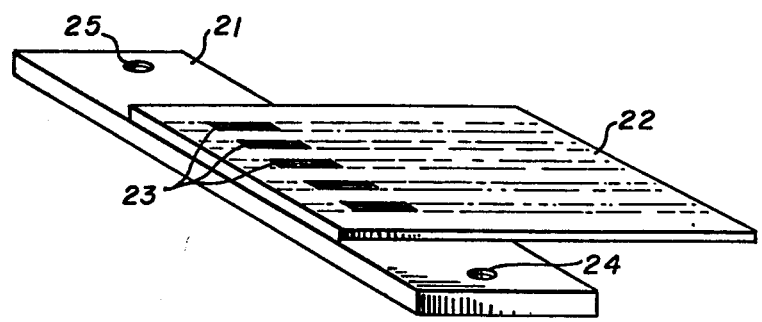
FIG. 4 is a perspective view of a pressure bar, which cooperates with the pressure bar of FIGS. 1 and 2, with an electrical circuit secured thereto.

As shown in FIG. 4, a solderless connector in accordance with the present invention may also include a second pressure bar 21. A second electrical circuit defining member 22, which for example may be another flexible circuit, is secured to bar 21. Circuit 22 includes a plurality of conductors having exposed terminal portions 23 which are spaced such as to be capable of being brought into alignment with the exposed portions 17 of the conductors of the circuit 15 of FIG. 3. Pressure bar 21 includes two holes 24 and 25 which are sized and spaced so as to be in alignment with the holes 12 and 13 of pressure bar 10. It should be understood that the pressure bar 21 and circuit 22 of FIG. 4 could be replaced by a connector or rigid printed circuit board.

Figure 5:
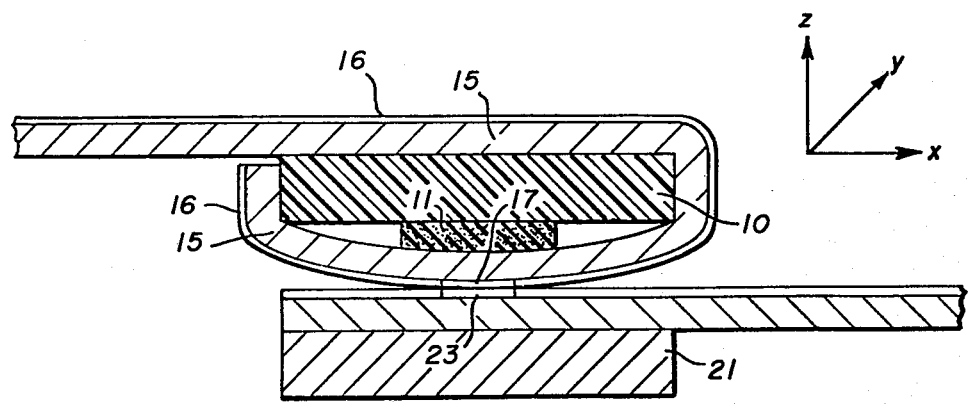
FIG. 5 is a cross-sectional side elevation view depicting use of the embodiment of the present invention shown in FIGS. 1–4 to interconnect the circuits shown secured to pressure bar components of a connector in FIGS. 3 and 4.

FIG. 5 depicts a cross-sectional view of a solderless connection affected through use of the devices and circuits shown in FIGS. 1-4. The view of FIG. 5 is taken along the plane of coordinates Z and X and the coordinate Y extends into the drawing. As described above in the discussion of the prior art, it is known to use a solid resilient pressure applicator, such as a rubber member, to press a pair of electrical contacts together. However, as also previously mentioned, compression of rubber in the Z direction will cause deformation and expansion thereof outwardly in the X and Y directions. Thus, were a prior art rubber pressure applicator to be employed in the solderless connection of FIG. 5, lateral forces in the Y direction would be applied to circuit 15 and these lateral forces would have a tendency to move the exposed terminal portions 17 and 23 of the conductors respectively on circuits 15 and 22 out of alignment. Use of an open celled resilient material in accordance with the present invention substantially eliminates this tendency of the circuit patterns to move out of alignment.

Figure 6:
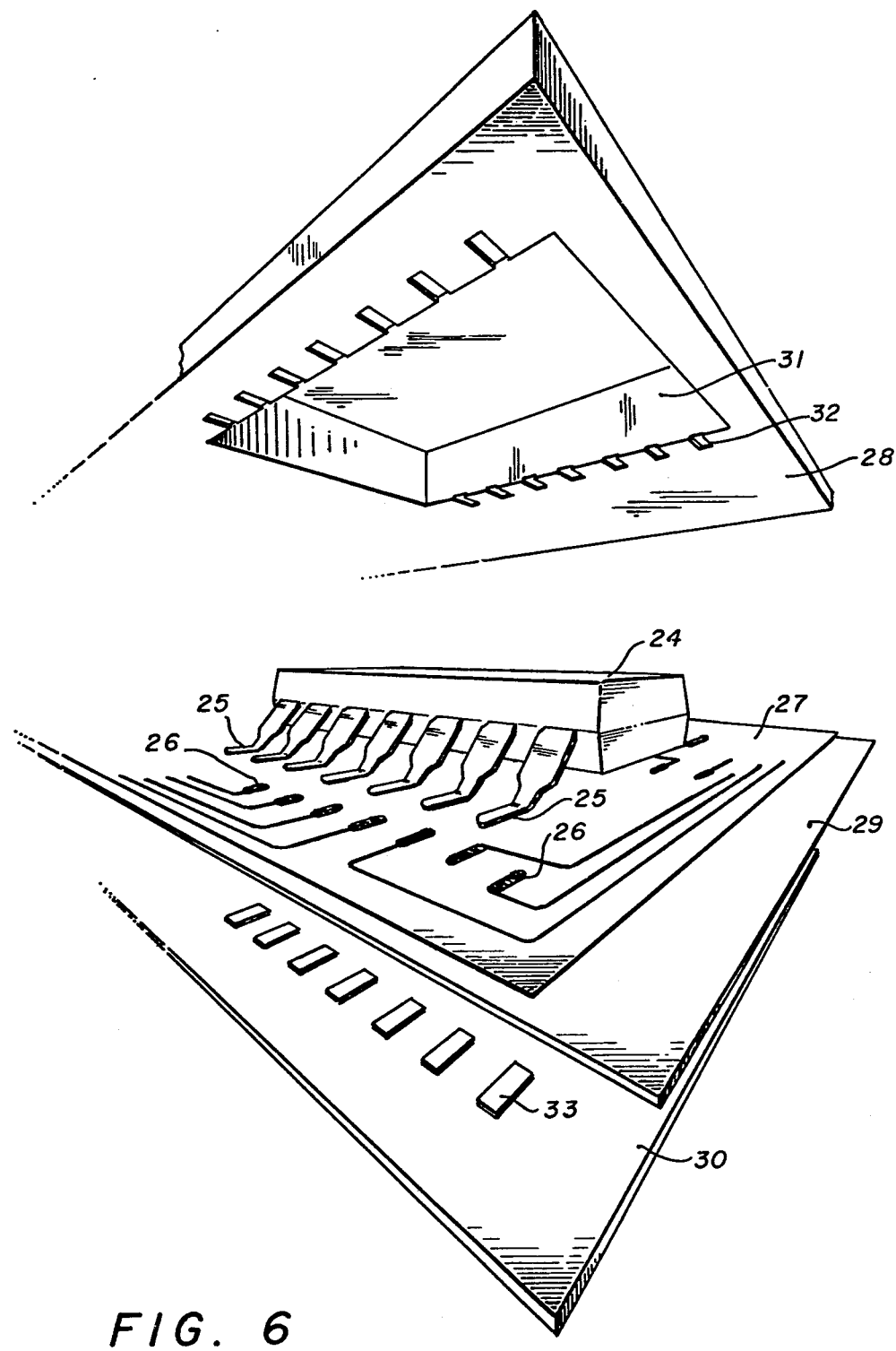
FIG. 6 is an exploded partial perspective view depicting use of the present invention to establish connection between a flexible circuit and an integrated circuit.

FIG. 6 shows a pressure applicator for connecting an active component, such as an integrated circuit 24, to a circuit comprising a plurality of conductors. The integrated circuit 24 will have a plurality of conductive tabs 25 extending therefrom. In order to permit integrated circuit 24 to perform its intended function or functions, the terminal or foot portions of the tabs or leads 25 extending therefrom must be connected to terminal portions 26 of a circuit carried by a substrate 27. In FIG. 6, the substrate 27 and conductors 26 define a flexible circuit. The solderless connector of the FIG. 6 embodiment includes an upper housing 28, a sheet of resilient cellular nonconductive material 29 and a lower housing 30. The upper housing 28 includes a recess 31 which is sized and shaped to receive and thus encapsulate integrated circuit 24. A plurality of alignment slots 32 are provided along opposite side edges of the recess 31 in upper housing 28. The alignment slots 32 are shallow in depth and are shaped to allow interfitting of the conductive tabs 25 therein. Lower housing portion 30 includes a series of protrusions 33 which are shaped and spaced to align with the slots 32 in the upper housing 28. The depth of slots 32 is slightly less than the thicknesses of tabs 25 so that, when tabs 25 are positioned within slots 32, the tabs extend outwardly beyond the surface of upper housing 28.

The integrated circuit 24 is electrically connected to the flexible circuit 27 in the following manner. Integrated circuit 24 is disposed within recess 31 with the conductive tabs 25 positioned within the slots 32. Exposed terminal portions 26 of the circuit on substrate 27 are aligned with the tabs 25 and the sheet of resilient material 29 is superimposed upon the flexible circuit as shown. The lower housing 30 is then positioned against sheet 29 with the protrusions 33 in alignment with the terminal portions 26 of the conductors and thus in alignment with the conductive tabs 25 in slots 32. Thereafter, upper housing 28 and lower housing 30 are urged together by any suitable means such as clamps or screws and nuts. In this manner, protrusions 33 are forced upwardly against sheet 29 and sheet 29 will deform; i.e., sheet 29 will be placed in compression at least in the contact aligned regions; and will securely maintain electrical contact between the conductive tabs 25 and the exposed terminal portions 26 of the flexible circuit.

Figure 7:
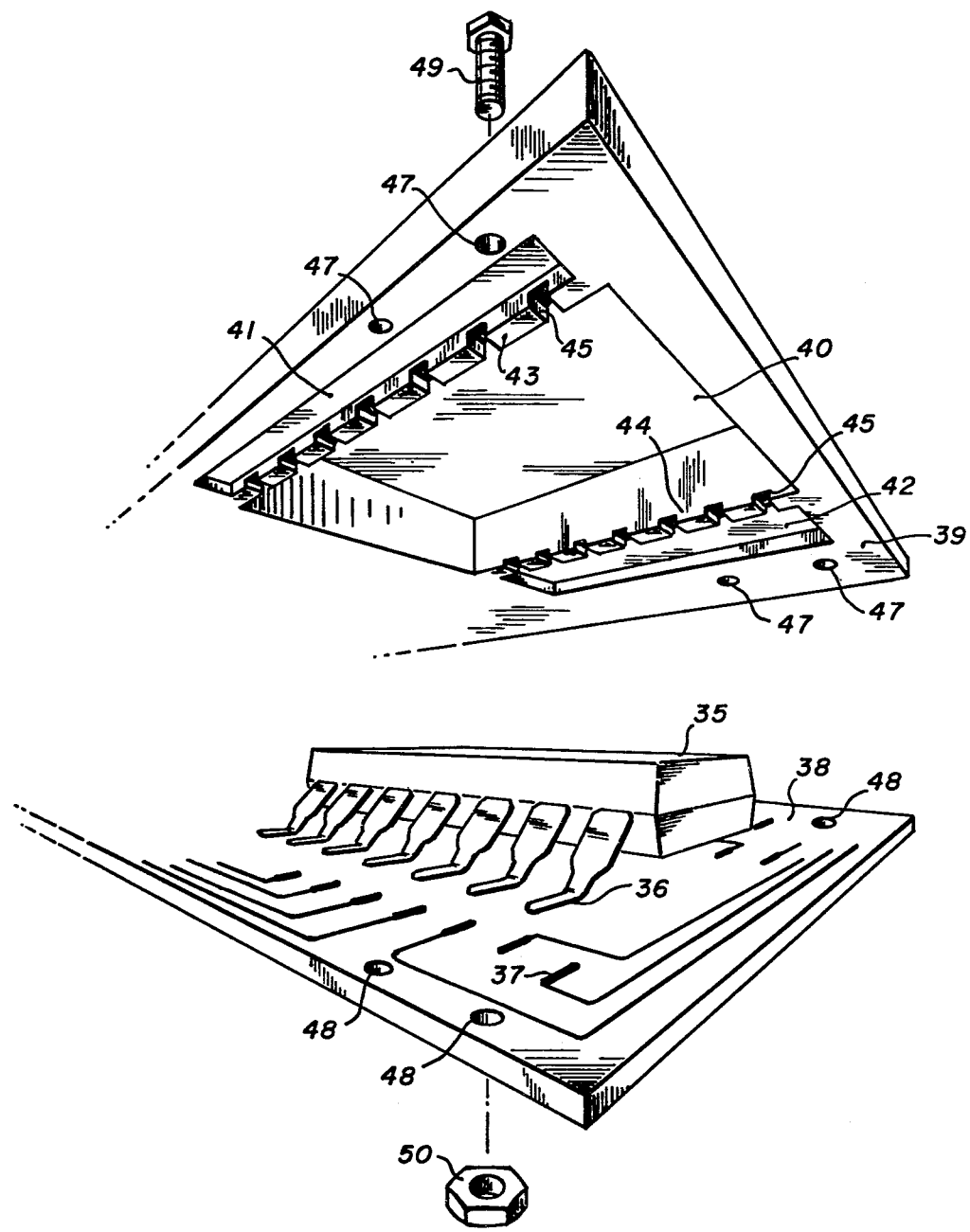
FIG. 7 is an exploded partial perspective view of a second embodiment of an interconnection technique for use with integrated circuits in accordance with the present invention.
Figure 8:
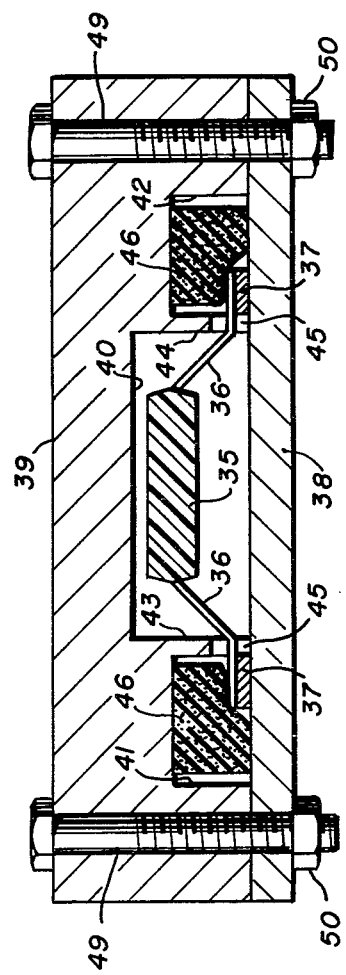
FIG. 8 is a cross-sectional side elevation view of the interconnection technique and apparatus of FIG. 7.

Referring now to FIGS. 7 and 8, an alternative embodiment of the invention for use with integrated circuits is shown. The embodiment of FIGS. 7 and 8 is particularly well suited for use in establishing a solderless connection between an active circuit device, which has been indicated at 35, and contacts 37 on a rigid circuit board. The active electronic circuit component 35 may, for example, be a dual in-line device which includes a plurality of conductive tabs 36. As in the embodiment of FIG. 6, the conductive tabs 36 are registered with and placed in contact with terminal pads 37 of the circuit on the printed circuit board 38. The solderless connector of the embodiment of FIGS. 7 and 8 includes an upper housing 39 having a recess 40 sized and shaped to receive the dual in-line circuit package 35. The upper housing 39 further includes elongated recesses 41 and 42 which extend along opposite sides of the recess 40. The recesses 41 and 42 are spaced outwardly from recess 40 by means of respective serrated walls 43 and 44. The slots 45 in the walls 43 and 44 are sized and shaped to receive the tabs 36 which extend from the circuit package 35. An elongated strip of resilient open celled non-conductive material 46 is positioned within each of recesses 41 and 42 as may be seen from FIG. 8. The upper housing 39 further includes a plurality of holes 47 which are shaped and spaced so as to align with holes 48 provided in the printed circuit board 38. When the housing 39 is positioned such that the holes 47 are in alignment with the holes 48 of the printed circuit board, the conductive tabs 36 will be in registration with the contact pads 37 of the printed circuit. By clamping the cover 39 to the printed circuit 38, using bolts 49 and nuts 50, the strips of resilient material 46 will be compressed and will resiliently load the tabs 36 against the terminal pads 37. As shown in FIG. 8, during the tightening of the nuts 50 the resilient material 46 is deformed in the region where the tabs 36 contact the terminal pads 37 and the thus established electrical contacts will be maintained between tabs 36 and the circuit defined on circuit board 38 as a result of the biasing of the tabs against the pads.

In accordance with the present invention, the material which defines the pressure applicator 11 of FIGS. 1–3 and 5, the sheet 29 of FIG. 6 and the strips 46 of FIGS. 7 and 8 consists of an open celled visco-elastic polymer and, in the preferred embodiment, a polyurethane foam. Particularly good results have been obtained employing a urethane formulation comprising a mixed polyester/polyether system. One open cell material suitable for use in the practice of the present invention is R/Flex 8770 obtainable from Rogers Corporation, Rogers, Conn. This material is characterized by a compressive load deflection at 25% compression in the range of 5 to 10 psi. A resilient material for use in the present invention is preferrably characterized by a compression set of less than 5%. The compression set is tested in accordance with ASTM standard D-1564 wherein a two inch square and one inch thick stack of sheets of material (about 60 mils/sheet) are compressed 50% to ½ inch thickness, the compressed material is subjected to 158° F. for 22 hours, the compression is released and the thickness is measured. The compression set of the R/Flex 8770 material after 5 hours of steam autoclaving prior to performing test ASTM D-1564 is less than 10%.

While preferred embodiments have been shown and described, various modifications and substitutions may be made thereto without departing from the spirit and scope of the invention. Thus, by way of example, while use of only a single resilient pressure applicator aligned with the points where electrical contact is to be established has been shown, a pair of oppositely disposed resilient members may be employed to urge the electrical contacts together from both sides. Accordingly, it is to be understood that the present invention has been described by way of illustration and not limitation.

What is claimed is:

1. A solderless connector for establishing and maintaining electrical contact between the terminal portions of a plurality of leads extending outwardly from at least a first electrical circuit component and a plurality of conductors, said connector comprising:
   a housing, said housing defining a pair of oppositely disposed planar surfaces, said housing further defining a component receiving recess, said housing additionally having a plurality of lead receiving guide slots in said one of said surfaces, said guide slots extending outwardly from said recess;
   a planar non-conductive substrate, said substrate supporting plural conductors on a first face thereof, at least some of said conductors terminating at exposed contact portions arranged in a pattern commensurate with the pattern of component lead terminal portions contact portions of said substrate supported conductors by said resilient sheet, wherein said housing is further provided with at least a first longitudinal groove formed in said one of said planar surfaces, said recess and said groove being in communication via said guide slots, the leads from a component disposed in said housing recess extending through said slots and terminating in said groove, said resilient member being disposed within said groove.

2. A solderless connector for establishing and maintaining electrical contact between the terminal portions of a plurality of leads extending outwardly from at least a first electrical circuit component and a plurality of conductors, said connector comprising:
   a housing, said housing defining a pair of oppositely disposed planar surfaces, said housing further defining a component receiving recess, said housing additionally having a plurality of lead receiving guide slots in said one of said surfaces, said guide slots extending outwardly from said recess;
   a planar non-conductive substrate, said substrate supporting plural conductors on a first race thereof, at least some of said conductors terminating at exposed contact portions arranged in a pattern commensurate with the pattern of component lead terminal portions established upon component insertion in said housing recess and positioning of the component leads in said guide slots;
   at least a first non-conductive, resilient, open-celled, visco-elastic member having a compression set of less than 5%, said resilient member being positioned in registration with at least the contact portions of said substrate supported conductors; and
   means for clamping said resilient member, said substrate and said housing together, said clamping means compressing said resilient member whereby the terminal portions of leads of a component positioned in said housing recess will be resiliently urged against contact portions of said substrate supported conductor by said resilient sheet, wherein said one of said surfaces of said housing is provided with a pair of parallel longitudinal grooves extending along opposite sides of said recess, said grooves being separated from said recess by walls, said guide slots extending through said walls, said first resilient member being positioned in a first of said grooves, said connector further comprising a second resilient member positioned in the other of said grooves.

3. A solderless connector for establishing and maintaining electrical contact between a plurality of leads extending outwardly from an integrated circuit and respective conductors of a plurality of conductors comprising:

a housing, said housing being provided with a recess for receiving the circuit, said housing further being provided with a plurality of guide slots for receiving the leads extending from the circuit;

a non-conductive substrate, said substrate supporting plural conductors on first face thereof, said conductors terminating at exposed contact portions arranged in a pattern commensurate with the pattern of circuit leads established upon circuit insertion in said housing recess and positioning of the leads extending therefrom in guide slots;

a plate, said plate having a plurality of protrusions on a first side thereof, said protrusions being arranged in a pattern corresponding to the pattern of contact portions on said substrate;

a sheet of resilient open-celled polyurethane disposed between said plate first side and second face of said substrate, said resilient sheet being characterized by compression set of less than 5%; and means for clamping said housing, plate, substrate and sheet together, said clamping means causing said protrusions on said plate to compress said resilient sheet, said compressed resilient sheet providing a force which biases the circuit leads against the contact portions of the substrate supported conductors and maintains the contact therebetween, the compression of said resilient sheet resulting in substantially no forces being applied to said leads and contact portions in a direction transverse to the biasing force.

4. The connector of claim 3 wherein said substrate comprises a flexible circuit and wherein said clamping means comprises:

means for urging said plate toward said housing.

* * * * *